(12) United States Patent  (10) Patent No.: US 8,772,056 B2
Wang et al.  (45) Date of Patent: Jul. 8, 2014

(54) DUMMY PATTERN DESIGN FOR THERMAL ANNEALING

(71) Applicant: Taiwan Semiconductor Manufacturing Company, Ltd., Hsin-Chu (TW)

(72) Inventors: Li-Ting Wang, Hsinchu (TW); Jiunn-Ren Hwang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/134,344

(22) Filed: Dec. 19, 2013

(65) Prior Publication Data

US 2014/0106538 A1 Apr. 17, 2014

Related U.S. Application Data

(62) Division of application No. 12/651,029, filed on Dec. 31, 2009, now Pat. No. 8,618,610.

(51) Int. Cl.
    *H01L 21/00* (2006.01)
(52) U.S. Cl.
    USPC .............................. 438/7; 257/368; 257/370
(58) Field of Classification Search
    USPC ..................... 257/368, 370; 438/7
    See application file for complete search history.

(56) References Cited

U.S. PATENT DOCUMENTS

2007/0287200 A1 12/2007 Anderson et al.

FOREIGN PATENT DOCUMENTS

CN 101454870 6/2009

OTHER PUBLICATIONS

Chinese Patent Office, Office Action dated May 3, 2012, Application No. 201010159309.7, 5 pages.
Merriam-Webster Dictionary definition—"align".

*Primary Examiner* — Kimberly Rizkallah
*Assistant Examiner* — Errol Fernandes
(74) *Attorney, Agent, or Firm* — Haynes and Boone, LLP (57) ABSTRACT

The present disclosure provides a semiconductor structure including a semiconductor substrate having a device region and a dummy region adjacent the device region; a plurality of active regions in the device region; and a plurality of dummy active regions in the dummy region, where each of the active regions has a first dimension in a first direction and a second dimension in a second direction perpendicular to the first direction, and the first dimension is substantially greater than the second dimension; and each of the dummy active regions has a third dimension in the first direction and a fourth dimension in the second direction, and the third dimension is substantially greater than the fourth dimension. The plurality of dummy active regions are configured such that thermal annealing effect in the dummy region is substantially equal to that of the device region.

20 Claims, 8 Drawing Sheets

DUMMY PATTERN DESIGN FOR THERMAL ANNEALING

CROSS-REFERENCE TO RELATED APPLICATIONS

This application is a divisional of U.S. application Ser. No. 12/651,029, which was filed on Dec. 31, 2009, now allowed, the entire disclosure of which is incorporated herein by reference.

BACKGROUND

A semiconductor wafer is processed in a semiconductor manufacturer to form various integrated circuits (IC) in different regions of the wafer. These regions are referred to as semiconductor die. The integrated circuit formed in each semiconductor dice includes a plurality of semiconductor devices including active devices such as transistors, diode and memory devices. The semiconductor devices may also include passive devices such as resistors and capacitors. Various semiconductor manufacturing processes are employed to form the semiconductor devices including etching, lithography process, ion implantation, thin film deposition, and thermal annealing. However, in the current integrated circuit and the method making the same, a thermal annealing process applied to a semiconductor wafer introduces device performance non-uniformity issue. The device performance varies from device to device in a semiconductor dice, degrading the overall quality of the integrated circuit formed in semiconductor die. Therefore, there is a need to an integrated circuit structure and the method masking the same to address the issue.

SUMMARY

The present disclosure provides a semiconductor structure in one embodiment. The semiconductor structure includes a semiconductor substrate having a device region and a dummy region adjacent the device region; a plurality of active regions in the device region; and a plurality of dummy active regions in the dummy region, wherein each of the active regions has a first dimension in a first direction and a second dimension in a second direction perpendicular to the first direction, and the first dimension is substantially greater than the second dimension; and each of the dummy active regions has a third dimension in the first direction and a fourth dimension in the second direction, and the third dimension is substantially greater than the fourth dimension. The plurality of dummy active regions are configured such that thermal annealing effect in the dummy region is substantially equal to that of the device region.

The present disclosure also provides another embodiment of a semiconductor structure. The semiconductor structure includes a silicon substrate having a device region on and a dummy region adjacent the device region; an active region in the device region, wherein the active regions includes first outlines defining a first dimension in a first direction and second outlines defining a second dimension in a second direction perpendicular to the first direction, and the first dimension is greater than the second dimension; and a dummy active region in the dummy region, wherein the dummy active region includes third outlines defining a third dimension in the first direction and fourth outlines defining a fourth dimension in the second direction, and the third dimension is greater than the fourth dimension.

The present disclosure also provides a method. The method includes providing a semiconductor substrate; forming a first plurality of shallow trench isolation (STI) within a device region of the semiconductor substrate, wherein the first plurality of STI defines a plurality of active regions each having a first geometry with a first dimension in a first direction and a second dimension in a second direction perpendicular to the first direction, and the first dimension is greater than the second dimension; and forming a second plurality of STI within a dummy region of the semiconductor substrate, wherein the dummy region is adjacent the device region, the second plurality of STI defines a plurality of dummy active regions each having a second geometry with a third dimension in the first direction and a fourth dimension in the second direction, and the third dimension is greater than the fourth dimension.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
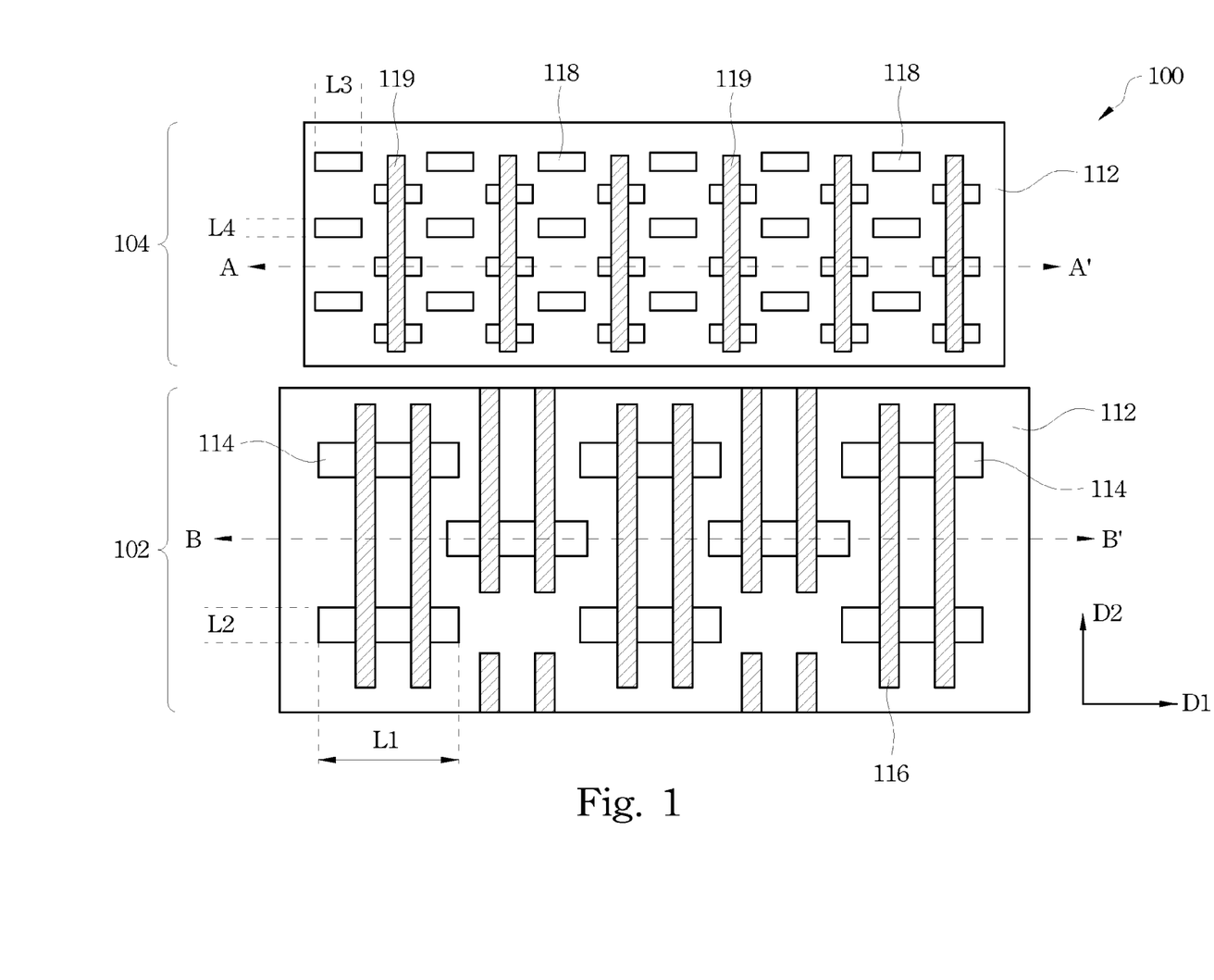
FIG. 1 is a top view of a semiconductor structure constructed according to aspects of the present disclosure in one embodiment.
Figure 2A:
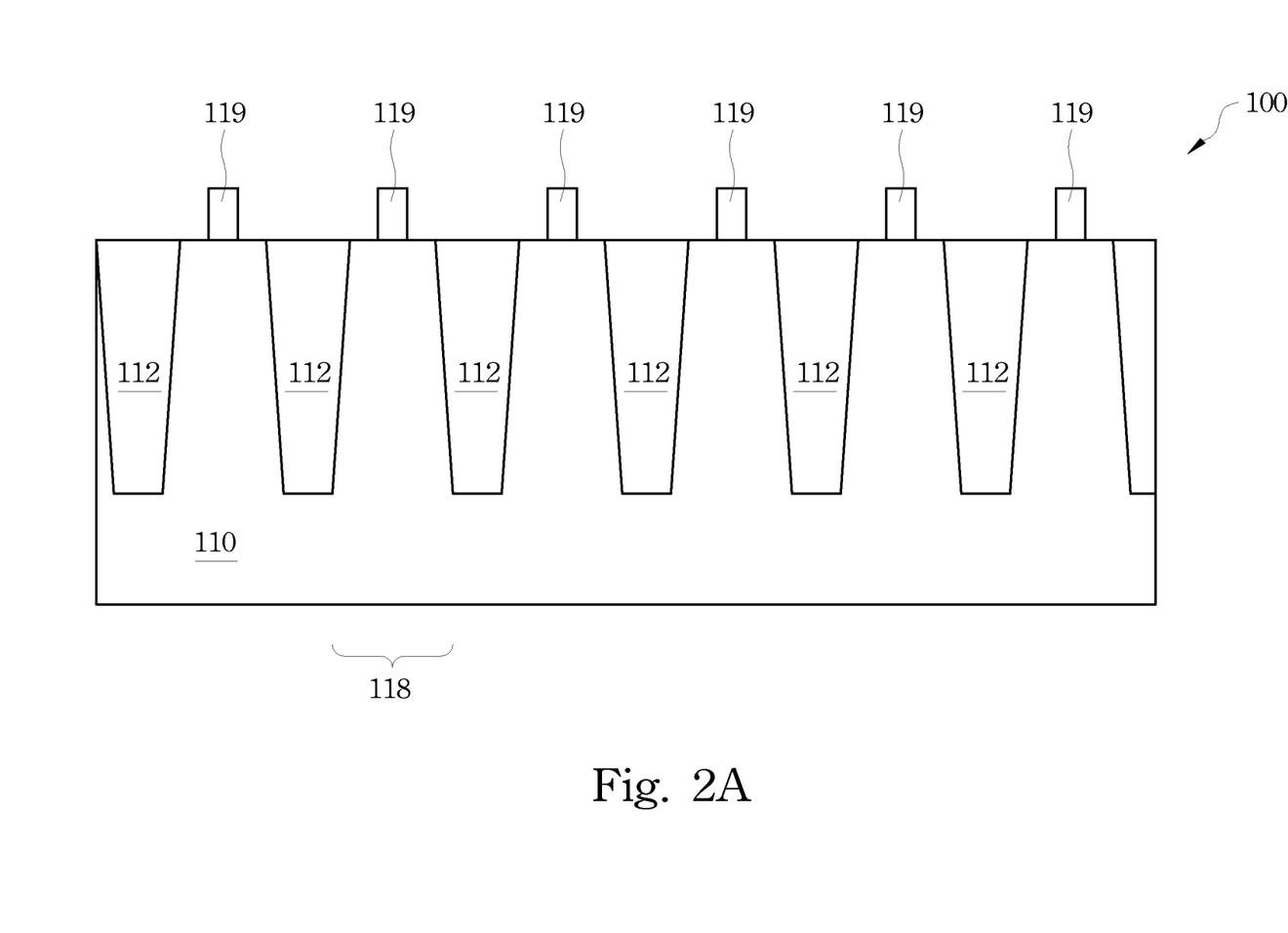
FIG. 2A is a sectional view of the semiconductor structure of FIG. 1 along line AA' constructed according to aspects of the present disclosure in one embodiment.
Figure 2B:
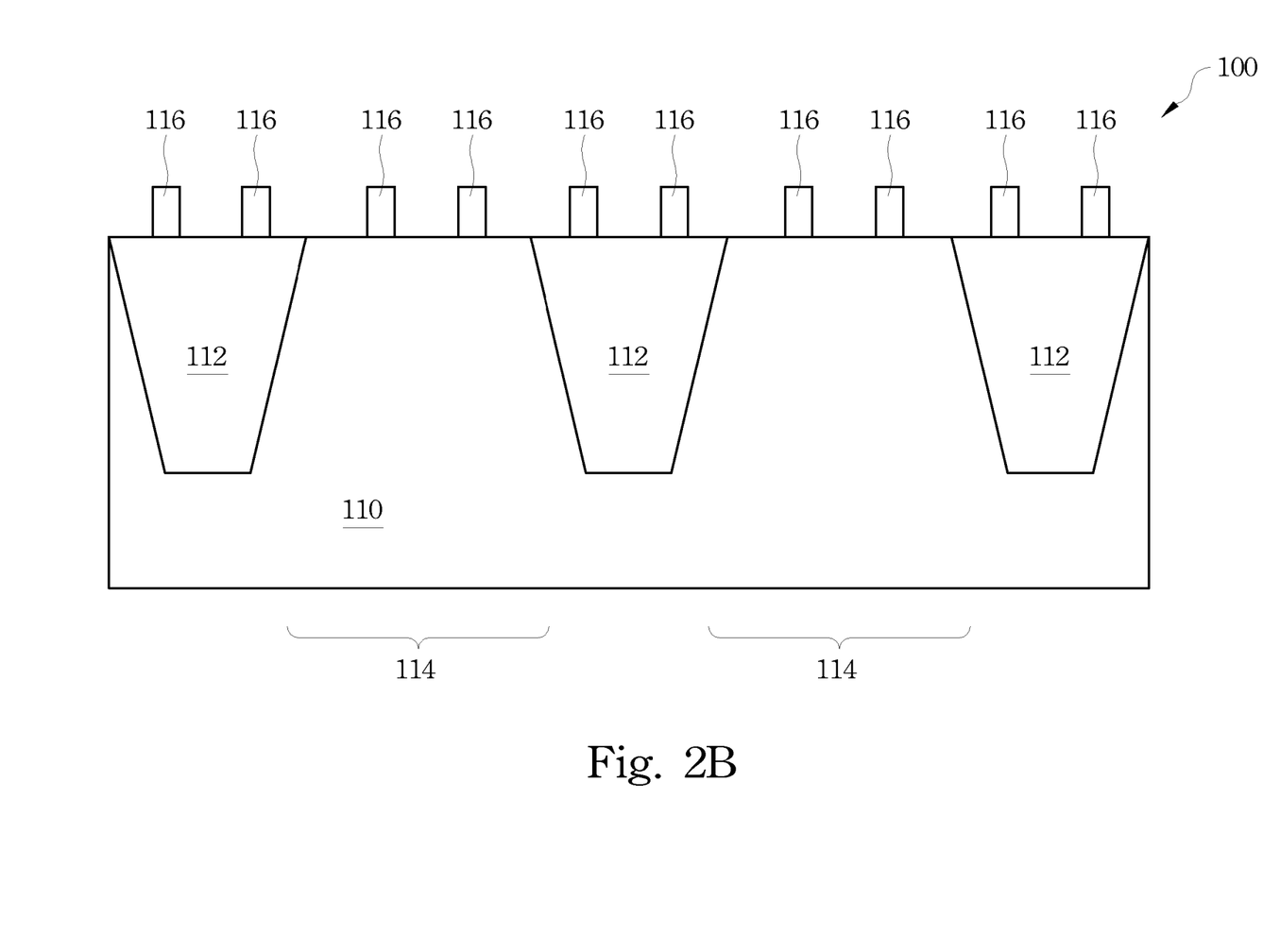
FIG. 2B is a sectional view of the semiconductor structure of FIG. 1 along line BB' constructed according to aspects of the present disclosure in one embodiment.

FIG. 1 is a top view of a semiconductor structure 100 constructed according to aspects of the present disclosure in one embodiment. FIG. 2A is a sectional view of the semiconductor structure 100 taken along a dashed line AA' in FIG. 1. FIG. 2B is a sectional view of the semiconductor structure 100 taken along a dashed line BB' in FIG. 1. The semiconductor structure 100 and the method making the same are collectively described with reference to FIGS. 1, 2A and 2B.

In one embodiment, the semiconductor structure 100 is a portion of a semiconductor wafer, or particularly a portion of a semiconductor dice (or a chip). The semiconductor structure 100 includes a device region 102 and a dummy region 104 adjacent the device region. As a particular example, the dummy region 104 is a small area surrounded by the device region 102. The device region 102 is designed to form a functional integrated circuit while the dummy region 104 is designed to form various dummy features to enhance various semiconductor manufacturing processes and improve the functional integrated circuit. In one embodiment, the device region 102 includes logic circuits including transistors, such as a field effect transistor (FET). In one embodiment, the field effect transistor is a metal-oxide-semiconductor (MOS) field effect transistor. In another embodiment, the device region 102 includes memory devices, such as static random access memory (SRAM) cells. A SRAM cell includes various capacitors and transistors configured and coupled to be functional for data storage and access.

The semiconductor structure 100 includes a semiconductor substrate 110. In one embodiment, the semiconductor substrate includes silicon. Alternatively, the substrate 110 includes germanium or silicon germanium. In other embodiments, the substrate 110 may use another semiconductor material, such as diamond, silicon carbide, gallium arsenic, GaAsP, AlInAs, AlGaAs, GaInP, or other proper combination thereof. Furthermore, the semiconductor substrate 110 may include a bulk semiconductor such as bulk silicon and an epitaxy silicon layer formed on he bulk silicon.

The semiconductor structure 100 further includes various dielectric features 112 formed in the semiconductor substrate 110 for isolation. In one embodiment, the isolation features 112 are formed by shallow trench isolation (STI) technique and are therefore referred to as STI structures or trench isolation features. The isolation features 112 may alternatively be formed other suitable technology such as local oxidation of silicon (LOCOS). The isolation features 112 formed in the semiconductor substrate define various active regions 114 where the semiconductor substrate 110 is uncovered by the isolation features 112.

In one embodiment, the shallow trench isolation features 112 can be formed by a procedure including etching the substrate for trenches, filling the trenches with a dielectric material and than applying a planarizing process to the substrate remove the excess dielectric material from the substrate. In one embodiment, the shallow trench isolation features 112 include silicon oxide. The silicon oxide can be filled in the trenches by a CVD process. In various examples, the silicon oxide can be formed by a high density plasma chemical vapor deposition (HDPCVD). The silicon oxide may be alternatively formed by a high aspect ratio process (HARP). In another embodiment, the trench isolation features 112 may include a multi-layer structure. In furtherance of the embodiment, the trench isolation features 112 include other suitable materials, such as silicon nitride, silicon oxynitride, low k materials, air gap, or combinations thereof, to form the trench isolation features.

For example, the isolation features 112 include a thermal oxide lining layer to improve the trench interface. In another example, the trenches are filled with a thermal silicon oxide lining layer and a HDPCVD silicon oxide layer. In another example, the trenches may have a multi-layer structure with a thermal oxide liner layer, a CVD silicon nitride layer, and a CVD silicon oxide layer. In one embodiment, the planarizing process includes a chemical mechanical polishing (CMP) process applied to the semiconductor substrate to remove excessive portions of the trench-filling dielectric material. As one example, the CMP process can use a silicon nitride layer as a polishing stop layer so that the CMP process can properly stop at the silicon nitride layer. Other process may be used to achieve the similar polishing effect. For example, an etchback process may be used to remove the excessive trench-filling dielectric material. An annealing process may be further applied to the trench isolation features 112 in the semiconductor substrate.

As described earlier, various active regions 114 are defined in the device region 102. These active regions 114 are designed form various circuit components and configured such that these circuit components are coupled to form a functional circuit. In one embodiment, various transistors can be formed in these active regions 114. As illustrated in the FIGS. 1 and 2, gates 116 are formed in the device region 102. Each gate includes a gate dielectric and a gate electrode disposed on the gate dielectric. In various embodiment, the gate dielectric includes silicon oxide, high k dielectric material or combination thereof. The gate electrode includes doped polysilicon, metal, or combination thereof. A pair of source and drain are further formed in each active region and interposed by the gate.

However, the dummy region 104 may have different silicon density relative to the device region 102, introducing non-uniform defects during various processing steps. In one example, the CMP process may introduce dishing, erosion or other effect because of the loading effect associated with different pattern density. Therefore, dummy patterns, such as dummy active region 118, dummy gate 119, or combination thereof, are introduced in the dummy region to provide a global uniform pattern density to enhance the CMP process and achieve a global planarizing surface after by the CMP process.

The manufacturing processes to form the semiconductor structure 100 include various thermal annealing steps that include, but not limited to, thermal annealing to form STI and thermal annealing processes applied to the semiconductor substrate after an ion implantation process. It has been identified in experiments that a thermal annealing process can generate different thermal effect in the device region 102 and the dummy region 104. Particularly, when a laser spike anneal (LSA) is used for the thermal annealing process, such annealing effect variation was identified with significant impact to the circuit quality and performance. The LSA is a thermal annealing tool employing laser energy for thermal annealing effect. The LSA provide vary rapid annealing, such as in millisecond and microsecond.

Figure 4:
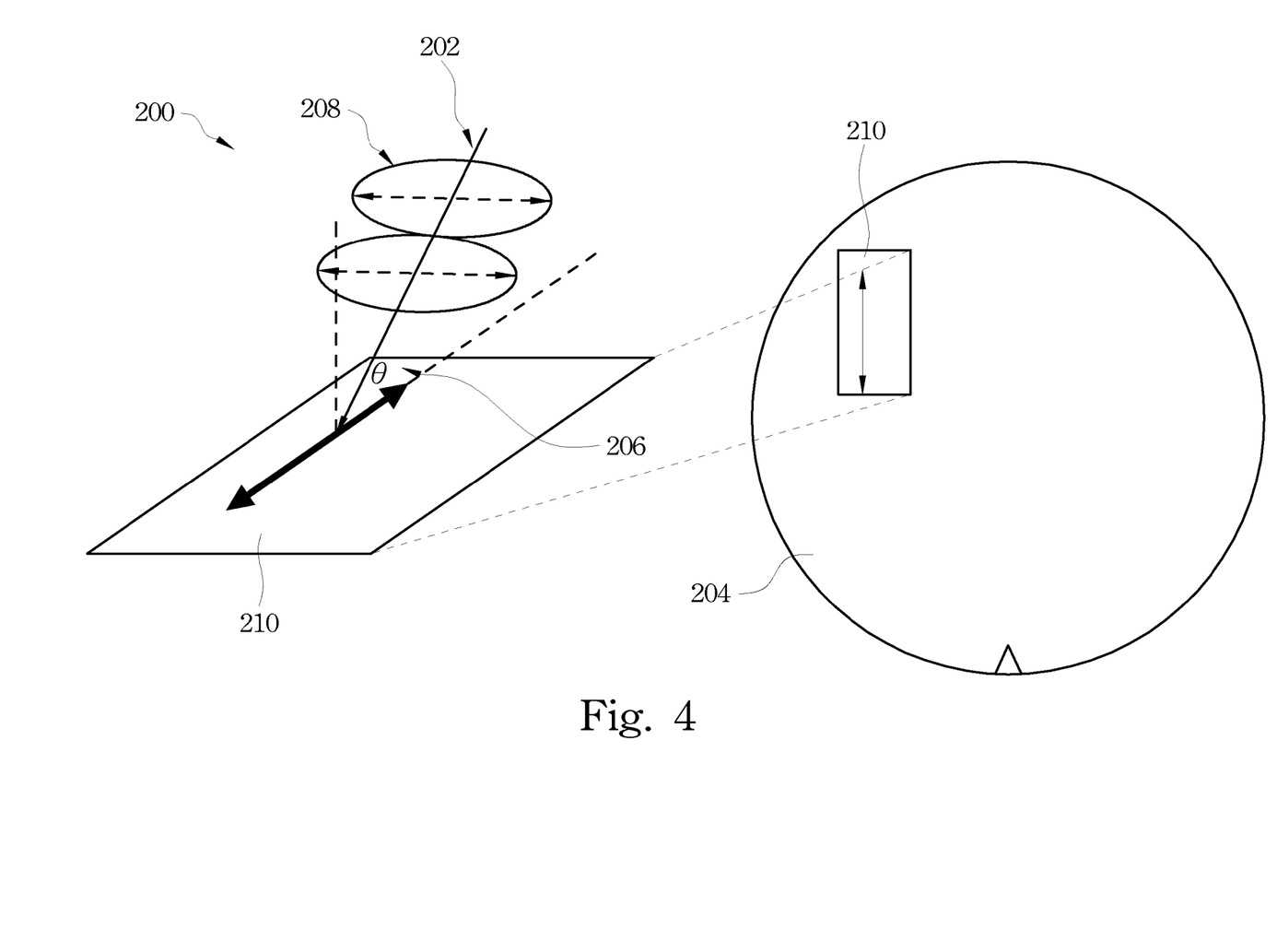
FIG. 4 is a schematic diagram illustrating for laser spike annealing constructed according to aspects of the present disclosure in one embodiment.

Referring to FIG. 4, one example of the LSA is a LSA system 200 developed by Ultratech, Inc., North America, 4 Constitution Way, Suite L, Woburn, Mass. 01801. The LSA system 200 includes carbon oxide ($CO_2$) gas used to generate laser with a wavelength at about 10.6 micrometer. In one application, when the laser beam 202 from the LSA system 200 is directed to the surface of a semiconductor substrate 204, the incident angle 206 is at about the Brewster angle (~72 degree, for example), such that the polarization direction 208 of the laser is substantially parallel to the surface of the semiconductor substrate 204. A portion of the semiconductor substrate 204 is zoomed out and is numbered as 210.

The experiments reveal that the thermal annealing effect is not only associated with the pattern density but also with the pattern orientation. The thermal annealing effect is particularly associated with the pattern density and the pattern orientation of the active regions and the dummy active regions. One experiment for revealing such association has been designed and implemented and is described below.

Figure 5:
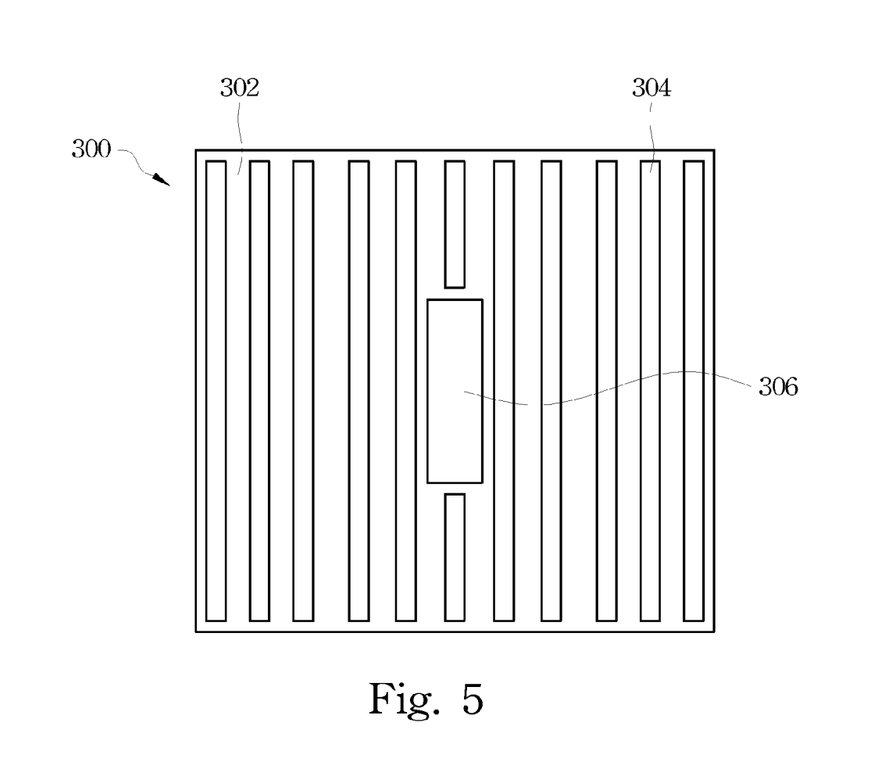
FIG. 5 is a top view of a test semiconductor structure constructed according to aspects of the present disclosure in one embodiment.
Figure 6:
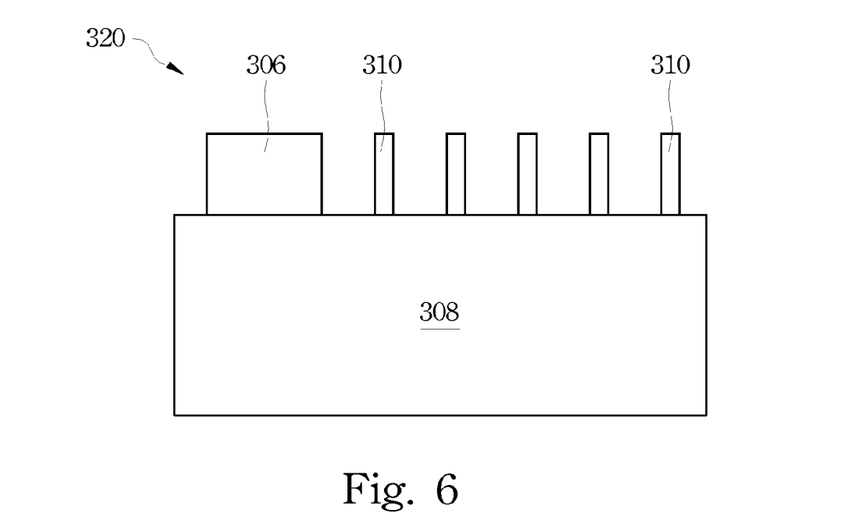
FIGS. 6 through 8 are sectional views of various test semiconductor structures constructed according to aspects of the present disclosure.
Figure 7:
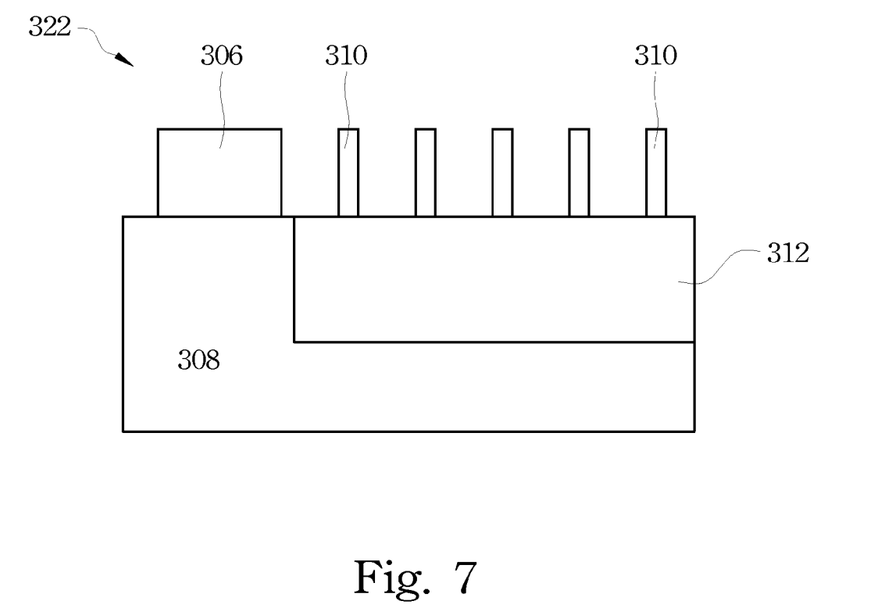
Figure 8:
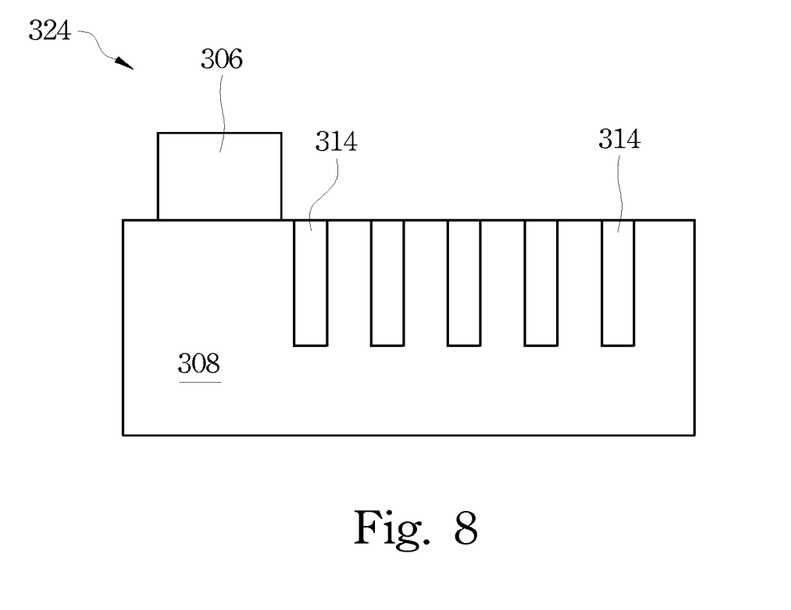

FIG. 5 is a top view of a test semiconductor structure 300 constructed according to various aspects of the present disclosure. FIGS. 6 through 8 are sectional views of various test semiconductor structures 320, 322 and 324, respectively, constructed according to various aspects of the present disclosure. The test semiconductor structure 300 includes dielectric isolation features 302, and active regions 304 defined by the dielectric isolation features. The dielectric isolation features 302 are shallow trench isolation filled with silicon oxide. The active regions 304 include silicon. A test pattern 306 is formed in the test semiconductor structure 300. The test pattern 306 includes a resistor designed and configured to be accessible for its resistance. In one example, the test pattern 306 is a doped polysilicon resistor.

Figure 9:
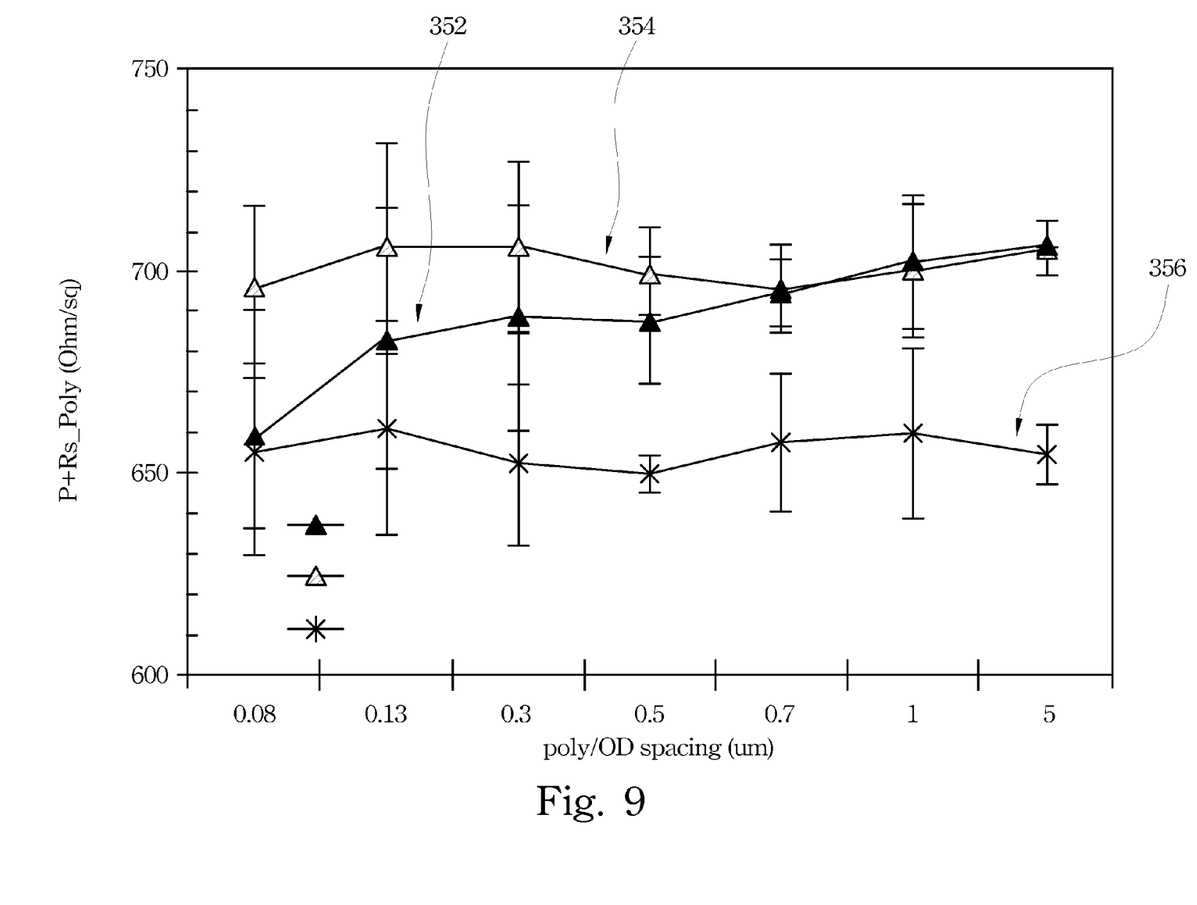
FIG. 9 is a diagram of experimental data collected from various test semiconductor structures of FIGS. 6 through 8.

As illustrated in FIG. 6, the test semiconductor structure 320 includes a silicon substrate 308, various polysilicon gate formed on the substrate 310, and a test pattern 306 disposed on the substrate. As illustrated in FIG. 7, the test semiconductor structure 322 includes a silicon substrate 308, various polysilicon gate formed on the substrate 310, a shallow trench isolation 312 formed in the substrate and a test pattern 306 disposed on the substrate. As illustrated in FIG. 8, the test semiconductor structure 324 includes a silicon substrate 308, various shallow trench isolation features 314 formed in the substrate and a test pattern 306 disposed on the substrate. The test semiconductor structure 324 may have a top view similar to that of the test semiconductor structure 300. All the test semiconductor structures 320, 322 and 324 have been used in the experiments. Furthermore, each test semiconductor structure is manufactured with various entities each having a different gate spacing, active region spacing or combination thereof. The gate spacing is defined as a distance between two adjacent gates. Similarly, the active region spacing is defined as a distance between two adjacent active regions. The gate spacing and active region spacing are defined in a direction toward the test pattern. The test patterns are designed to be substantially the same in each of the test semiconductor structures. The experiment includes applying a thermal annealing process to one test semiconductor, and measuring the resistance of the test pattern after the thermal annealing process. The same test procedure is repeated for each of the test semiconductor structures with the same thermal annealing process. One of the experiment results is provided in FIG. 9, wherein the horizontal axis represents polysilicon spacing or active region spacing, and the vertical axis represents a resistivity of the test pattern. The curve 352 represents data from the test structure 324 of FIG. 8, in which the active region spacing is varied accordingly. The curve 354 represents data from various test structure 322 of FIG. 7, in which the gate spacing is varied accordingly. The curve 356 represents data from the test structure 320 of FIG. 6, in which the gate spacing is varied accordingly. Based on the data in FIG. 9 and other experimental results, we identified that the thermal annealing process variation is more sensitive to the active region pattern density and the active region spacing. One contribution to that variation is from the changes of the thermal energy path in the semiconductor substrate. Note that the gate spacing and active region spacing are defined in a direction toward the test pattern. The active regions with less spacing provides less resistance in the thermal energy path. It is also concluded from these experiments that the orientation of the dummy active regions is a sensitive factor to the thermal annealing process. Therefore, the dummy pattern is designed for optimized thermal annealing process and uniform device performance.

Referring back to FIGS. 1 and 2, the active regions 114 in the device region 102 is designed with a geometry having a first dimension "L1" in a first direction "D1" and a second dimension "L2" in a second direction "D2" perpendicular to the first direction, as illustrated in FIG. 2B. The first dimension L1 is substantially greater than the second dimension L2. The active region 114 can be designed in any proper geometry. In one example, the active region has a rectangle geometry. The dummy active regions 118 in the dummy region 104 is designed with a geometry having a third dimension "L3" in the first direction "D1" and a fourth dimension "L4" in the second direction "D2". The third dimension L3 is substantially greater than the fourth dimension L4. In one embodiment, the third dimension L3 ranges between about 0.1 and about 10 of the first dimension L1. In another embodiment, the fourth dimension L4 ranges between about 0.1 and about 10 of the second dimension L2. In another embodiment, the active regions 114 is substantially similar to the dummy active regions 118 in term of pattern dimensions. For example, L1 substantially equals to L3, and L2 substantially equals to L4. The dummy active region 118 can be designed in any proper geometry. In one example, the dummy active region has a rectangle geometry. The dummy active regions thus configured are aligned with the active regions in the adjacent device region. The dummy active regions are further designed with an active region pattern density substantially equal to the active region pattern density of the active regions in the device region. The active region pattern density is defined as a ratio between the area of the active regions (or dummy active regions) in a certain area of the device region (or dummy region) and that certain area. In another embodiment, the active regions 114 are substantially similar to the dummy active regions 118 in terms of pattern geometry, pattern geometry and pattern dimensions. Thus, designed dummy active regions in the dummy region are aimed to achieve the substantial similar thermal effect of the adjacent device region during a thermal annealing process applied to the semiconductor substrate.

Figure 3:
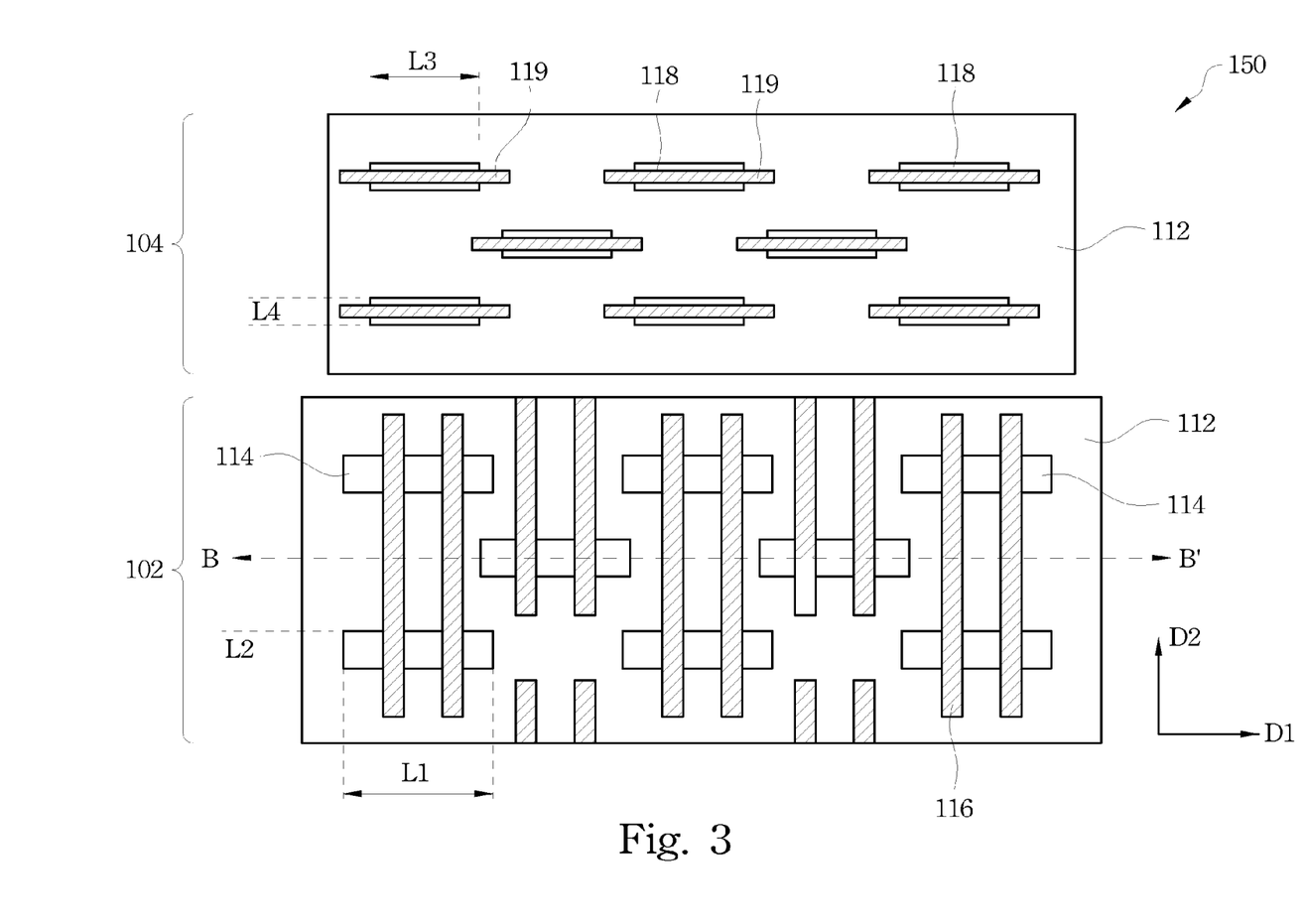
FIG. 3 is a top view of a semiconductor structure constructed according to aspects of the present disclosure in another embodiment.

Additionally, the dummy gates 119 formed in the dummy region 104 are designed and configured substantially similar to the gates 116 formed in the device region 102. For example, the dummy gates 119 formed in the dummy region 104 are aligned with the gate 116 formed in the device region 102. Particularly, the functional gate in the device region has a first dimension in a primary direction and a second dimension in another direction perpendicular to the primary direction. The dummy gate in the dummy region has a third dimension in the primary direction and a fourth dimension in the another direction. The first dimension is substantially greater than the second dimension and the third dimension is substantially greater than the fourth dimension. In another embodiment, the third dimension of the dummy gate ranges between about 0.1 and about 10 of the first dimension of the functional gate. Similarly, the fourth dimension of the dummy gate ranges between about 0.1 and about 10 of the second dimension of the functional gate. In a particular example, the gates 116 are substantially similar to the dummy gates 119 in terms of pattern geometry, pattern geometry and pattern dimensions. Thus, designed dummy gates in the dummy region are aimed to further approach the substantial similar thermal effect of the adjacent device region during a thermal annealing process applied to the semiconductor substrate. In another embodiment, the dummy gates 119 are alternatively oriented such that the dummy gates are aligned with the dummy active regions 118, as illustrated in FIG. 3, designed and configured to achieve a substantially similar thermal effect of the adjacent device region during a thermal annealing process applied to the semiconductor substrate.

Although embodiments of the present disclosure have been described in detail, those skilled in the art should understand that they may make various changes, substitutions, and alterations herein without departing from the spirit and scope of the present disclosure. For example, the thermal annealing process is not limited to the laser spike annealing and can include other type annealing process, such as rapid thermal annealing (RTA) process. Those other thermal annealing process can be effectively improved by the semiconductor structure 100 in the present disclosure. In another embodiment, the dummy features (active regions and/or gates) in the dummy region are more similar to the corresponding device features in the device region in term of pattern dimension, pattern geometry and pattern density when the dummy features are more close to the adjacent device region.

The dummy active regions in the dummy region and the active regions in the device region are formed in the semiconductor substrate and defined by forming the isolation features in the semiconductor substrate. The dummy active regions in the dummy region and the active regions in the device region are formed simultaneously by one manufacturing procedure. In one embodiment, shallow trench isolation technique is used to form isolation features, the manufacturing procedure used to form STI structures includes lithography process, etching, deposition of dielectric material and chemical mechanic planarizing (CMP) process. The lithography process utilizes a photomask having a predefined pattern of the shallow trench isolation regions and is used to be imaged on the semiconductor substrate. The predefined pattern on the photomask is similar to the shallow trench isolation pattern described in FIG. 1 and may includes additional features, such as assistant features for optical proximity correction.

Although not shown, other features and the processing steps making these features may present, including various doped regions such as source and drain regions, device features such as silicide for contact, and multilayer interconnection (MLI). In one example, the gate (dummy gate as well) may include a gate dielectric, a gate electrode, a silicide contact layer, and gate spacers. The gate dielectric includes silicon oxide, silicon oxynitride, high-k material, or combinations thereof. The gate electrode may include doped polysilicon, metal, metal silicide, other conductive material, or combinations thereof. The silicide contact layer includes nickel silicide, cobalt silicide, tungsten silicide, tantalum silicide, titanium silicide, platinum silicide, erbium silicide, palladium silicide, or combinations thereof. The gate spacers may have a multilayer structure and may include silicon oxide, silicon nitride, silicon oxynitride, or other dielectric materials.

In another embodiment of the formation of the shallow trench isolation, a hard mask layer is used to form one or more openings defining isolation regions. The hard mask includes a silicon nitride layer. In another embodiment, the hard mask includes a silicon oxide layer and a silicon nitride layer disposed on the silicon oxide layer. A photolithography process and an etching process are used to pattern the hard mask layer. An exemplary photolithography process may include photoresist patterning, etching, and photoresist stripping. The photoresist patterning may further include processing steps of photoresist coating, soft baking, mask aligning, exposing pattern, post-exposure baking, developing photoresist, and hard baking Photolithography patterning may also be implemented or replaced by other proper methods, such as maskless photolithography, electron-beam writing, ion-beam writing, and molecular imprint. The etching process may include a wet etching or dry etching process. In one example, a dry etching process used to etch the silicon nitride includes a chemistry including fluorine-containing gas. In furtherance of the example, the chemistry of the dry etch includes $CF_4$, $SF_6$, or $NF_3$. As another example of the wet etching process to the silicon nitride layer, the etchant includes a phosphoric acid ($H_3PO_4$) solution. In another example, a hydrofluoric acid (HF) or buffered HF may be used to etch the silicon dioxide layer to expose the semiconductor substrate within the openings defined by the silicon nitride layer.

The semiconductor structure 100 also includes vertical interconnects, such as conventional vias or contacts, and horizontal interconnects, such as metal lines. The various interconnection features may implement various conductive materials including copper, tungsten, and silicide. In one example, a damascene process is used to form copper related multilayer interconnection structures. In another embodiment, tungsten is used to form tungsten plugs in the contact holes.

The semiconductor structure 100 further includes doped source and drain regions and light doped drain regions of either an n-type dopant or a p-type dopant formed by a conventional doping process such as ion implantation. N-type dopant impurities employed to form the doped regions may include phosphorus, arsenic, and/or other materials. P-type dopant impurities may include boron, indium, and/or other materials.

The present disclosure is not limited to applications in which the semiconductor structure 100 has a MOS transistor, and may be extended to any other proper integrated circuit. For example, in other embodiments, the semiconductor structure 100 may include a memory device, a sensor device, and/or other microelectronic devices (collectively referred to herein as microelectronic devices). In another embodiment, the semiconductor structure 100 may include FinFET transistors. Of course, aspects of the present disclosure are also applicable and/or readily adaptable to any type of transistor, including single-gate transistors, double-gate transistors, and other multiple-gate transistors, and may be employed in many different applications, including sensor cells, memory cells, logic cells, and others.

The semiconductor structure 100 serves as only one example of a device within which various aspects of FIGS. 1-2 may be implemented. The semiconductor structure 100 and the method of making the same may be used in other semiconductor devices having high k and metal gate features, a strained semiconductor substrate, a hetero-semiconductor device, or a stress-free isolation structure.

Thus, the present disclosure provides a semiconductor structure. The semiconductor structure includes a semiconductor substrate having a device region and a dummy region adjacent the device region; a plurality of active regions in the device region; and a plurality of dummy active regions in the dummy region, wherein each of the active regions has a first dimension in a first direction and a second dimension in a second direction perpendicular to the first direction, and the first dimension is substantially greater than the second dimension; and each of the dummy active regions has a third dimension in the first direction and a fourth dimension in the second direction, and the third dimension is substantially greater than the fourth dimension. The plurality of dummy active regions are configured such that thermal annealing effect in the dummy region is substantially equal to that of the device region.

In various embodiments of the semiconductor structure, the third dimension ranges between about 0.1 and about 10 of the first dimension. The fourth dimension ranges between about 0.1 and about 10 of the second dimension. Each of the active regions has a rectangle geometry. Each of the dummy active regions has a rectangle geometry. In one embodiment, the device region includes a field effect transistor. In another embodiment, the device region includes a static random access memory (SRAM) cell. The device region further includes first isolation features formed between adjacent two of the active regions and the dummy region further includes second isolation features formed between adjacent two of the dummy active regions. The first and second isolation features include a dielectric material selected from the group consisting of silicon oxide, silicon nitride, silicon oxynitride, and combinations thereof. In one embodiment, the plurality of dummy active regions in the dummy region has an active region pattern density substantially equal to the active region pattern density of the plurality of the active regions in the device region.

The present disclosure also provides another embodiment of a semiconductor structure. The semiconductor structure includes a silicon substrate having a device region on and a dummy region adjacent the device region; an active region in the device region, wherein the active regions includes first outlines defining a first dimension in a first direction and second outlines defining a second dimension in a second direction perpendicular to the first direction, and the first dimension is greater than the second dimension; and a dummy active region in the dummy region, wherein the dummy active region includes third outlines defining a third dimension in the first direction and fourth outlines defining a fourth dimension in the second direction, and the third dimension is greater than the fourth dimension.

In the disclosed semiconductor structure, the third dimension ranges between about 0.1 and about 10 of the first dimension and the fourth dimension ranges between about 0.1 and about 10 of the second dimension. In one embodiment, the active region defines a first rectangle and the dummy active region defines a second rectangle. In another embodiment, the active region and the dummy active region are defined in the silicon substrate by forming various shallow trench isolation (STI) structures in the active region and dummy region. The various STI structures are formed by a manufacturing procedure including lithography process, etching, deposition of dielectric material and chemical mechanic planarizing (CMP) process. The semiconductor structure may further include a functional gate disposed on the active region and a dummy gate disposed on the dummy region.

The present disclosure also provides a method. The method includes providing a semiconductor substrate; forming a first plurality of shallow trench isolation (STI) within a device region of the semiconductor substrate, wherein the first plurality of STI defines a plurality of active regions each having a first geometry with a first dimension in a first direction and a second dimension in a second direction perpendicular to the first direction, and the first dimension is greater than the second dimension; and forming a second plurality of STI within a dummy region of the semiconductor substrate, wherein the dummy region is adjacent the device region, the second plurality of STI defines a plurality of dummy active regions each having a second geometry with a third dimension in the first direction and a fourth dimension in the second direction, and the third dimension is greater than the fourth dimension.

In one embodiment of the disclosed method, the third dimension ranges between about 0.1 and about 10 of the first dimension and the fourth dimension ranges between about 0.1 and about 10 of the second dimension. In another embodiment, the method further includes applying a thermal annealing process to the semiconductor substrate after the forming of the first plurality of STI and the forming of the second plurality of STI. In one example, the applying of the thermal annealing process includes applying a laser spike annealing (LSA) process to the semiconductor substrate. The forming of the first plurality of STI and the forming of the second plurality of STI are implemented simultaneously by a manufacturing procedure including lithography process, etching, deposition of dielectric material and chemical mechanic planarizing (CMP) process.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
    providing a semiconductor substrate;
    forming a first plurality of shallow trench isolation (STI) features within a device region of the semiconductor substrate, wherein the first plurality of STI features define a plurality of active regions each having a first geometry with a first dimension in a first direction and a second dimension in a second direction perpendicular to the first direction; and
    forming a second plurality of STI features within a dummy region of the semiconductor substrate, wherein the dummy region is adjacent the device region and the second plurality of STI features define a plurality of dummy active regions each having a second geometry with a third dimension in the first direction and a fourth dimension in the second direction,
    wherein the plurality of dummy active regions are all aligned with the plurality of active regions; and
    wherein the first dimension of each of the active regions is parallel to the third dimension of each of the dummy active regions.

2. The method of claim 1, wherein the third dimension ranges between about 0.1 and about 10 of the first dimension.

3. The method of claim 1, wherein the fourth dimension ranges between about 0.1 and about 10 of the second dimension.

4. The method of claim 1, wherein each of the active regions has a rectangle geometry.

5. The method of claim 1, wherein each of the dummy active regions has a rectangle geometry.

6. The method of claim 1, further comprising applying a thermal annealing process to the semiconductor substrate after the forming of the first plurality of STI features and the forming of the second plurality of STI features.

7. The method of claim 6, wherein the applying of the thermal annealing process includes applying a laser spike annealing (LSA) process to the semiconductor substrate.

8. The method of claim 1, wherein the forming of the first plurality of STI features and the forming of the second plurality of STI features are implemented simultaneously by a manufacturing procedure including lithography process, etching, deposition of dielectric material and chemical mechanical planarizing (CMP) process.

9. The method of claim 1, wherein the plurality of dummy active regions in the dummy region have an active region pattern density substantially equal to the active region pattern density of the plurality of the active regions in the device region.

10. A method, comprising: providing a semiconductor substrate;
forming a first plurality of shallow trench isolation (STI) features within a device region of the semiconductor substrate, wherein the first plurality of STI features define a plurality of active regions each having a first geometry with a first dimension in a first direction and a second dimension in a second direction perpendicular to the first direction, and wherein the first dimension is greater than the second dimension; and
forming a second plurality of STI features within a dummy region of the semiconductor substrate, wherein the dummy region is adjacent the device region and the second plurality of STI features define a plurality of dummy active regions each having a second geometry with a third dimension in the first direction and a fourth dimension in the second direction, and wherein the third dimension is greater than the fourth dimension,
wherein the plurality of dummy active regions are all aligned with the plurality of active regions; and
wherein the first dimension of each of the active regions is parallel to the third dimension of each of the dummy active regions.

11. The method of claim 10, wherein the third dimension ranges between about 0.1 and about 10 of the first dimension.

12. The method of claim 10, wherein the fourth dimension ranges between about 0.1 and about 10 of the second dimension.

13. The method of claim 10, further comprising applying a thermal annealing process to the semiconductor substrate after the forming of the first plurality of STI features and the forming of the second plurality of STI features.

14. The method of claim 13, wherein the applying of the thermal annealing process includes applying a laser spike annealing (LSA) process to the semiconductor substrate.

15. The method of claim 10, wherein the forming of the first plurality of STI features and the forming of the second plurality of STI features are implemented simultaneously by a manufacturing procedure including lithography process, etching, deposition of dielectric material and chemical mechanical planarizing (CMP) process.

16. A method, comprising: providing a silicon substrate;
forming a first plurality of shallow trench isolation (STI) features within a device region of the semiconductor substrate, wherein the first plurality of STI features define a plurality of active regions that include first outlines defining a first dimension in a first direction and second outlines defining a second dimension in a second direction perpendicular to the first direction, and wherein the first dimension is greater than the second dimension; and
forming a second plurality of STI features within a dummy region of the semiconductor substrate, wherein the dummy region is adjacent the device region, the second plurality of STI features define a plurality of dummy active regions that include third outlines defining a third dimension in the first direction and fourth outlines defining a fourth dimension in the second direction, and wherein the third dimension is greater than the fourth dimension,
wherein the plurality of dummy active regions are all aligned with the plurality of active regions; and
wherein the first dimension of each of the active regions is parallel to the third dimension of each of the dummy active regions.

17. The method of claim 16, wherein the third dimension ranges between about 0.1 to about 10 of the first dimension, and the fourth dimension ranges between about 0.1 and about 10 of the second dimension.

18. The method of claim 16, further comprising applying a thermal annealing process to the silicon substrate after the forming of the first plurality of STI features and the forming of the second plurality of STI features.

19. The method of claim 18, wherein the applying of the thermal annealing process includes applying a laser spike annealing (LSA) process to the silicon substrate.

20. The method of claim 16, wherein the forming of the first plurality of STI features and the forming of the second plurality of STI features are implemented simultaneously by a manufacturing procedure including lithography process, etching, deposition of dielectric material and chemical mechanical planarizing (CMP) process.

* * * * *